United States Patent [19]

Cherian et al.

[11] 4,199,209

[45] Apr. 22, 1980

[54] ELECTRICAL INTERCONNECTING DEVICE

[75] Inventors: Gabriel B. Cherian, York; William S. Scheingold; Richard H. Zimmerman, both of Palmyra, all of Pa.

[73] Assignee: AMP Incorporated, Harrisburg, Pa.

[21] Appl. No.: 935,042

[22] Filed: Aug. 18, 1978

[51] Int. Cl.² .......................................... H01R 13/48
[52] U.S. Cl. ............................. 339/59 M; 339/17 M; 339/222
[58] Field of Search ............ 339/17 M, 17 LM, 59 M, 339/61 M, 222; 174/35 GC

[56] References Cited

U.S. PATENT DOCUMENTS

| | | | |
|---|---|---|---|
| 2,454,567 | 11/1948 | Pierson, Jr. | 174/35 GC |
| 2,674,644 | 4/1954 | Goodloe | 174/35 GC |
| 3,126,440 | 3/1964 | Goodloe | 174/35 GC |
| 3,230,294 | 1/1966 | McAdams | 174/35 GC |
| 3,795,037 | 3/1974 | Luttmer | 339/17 M |
| 3,795,884 | 3/1974 | Kotaka | 339/17 LM |
| 3,852,878 | 12/1974 | Munro | 29/629 |
| 3,862,790 | 1/1975 | Davies et al. | 339/17 LM |
| 3,954,317 | 5/1976 | Gilissen | 339/17 E |
| 3,994,552 | 11/1976 | Selvin | 339/49 B |
| 4,016,647 | 4/1977 | Silissen | 29/629 |

FOREIGN PATENT DOCUMENTS 1339542  9/1963  France ..................................... 339/222

OTHER PUBLICATIONS

IBM Bulletin, Faure et al., Pin Pad Contacter, 1974-07, pp. 444 & 445, vol. 17, No. 2.

*Primary Examiner*—Joseph M. McGlynn
*Attorney, Agent, or Firm*—Allan B. Osborne

[57] ABSTRACT

The present invention relates to a device for electrically interconnecting two printed circuit boards or the like where the conductive pads are on extremely close spacing. More particularly, the invention includes a plurality of resilient connectors embedded in an elastomeric material with opposing ends thereof being exposed on opposite surfaces of the elastomeric body to provide contact points.

4 Claims, 6 Drawing Figures

ELECTRICAL INTERCONNECTING DEVICE

BACKGROUND OF THE INVENTION

1. Field Of The Invention

The present invention relates to electrical devices useful for interconnecting circuitry on spaced apart P.C. boards or other like devices, for example, substrates having a high density of electronic components thereon.

2. Prior Art

The present invention is a novel improvement and a departure from at least the following:

| Patent | Patentee | Class/subclass |
|---|---|---|
| 3,795,037 | Luttmer | 29/628 |
| 3,795,884 | Kotaka | 339/17 L M |
| 4,016,647 | Gilissen | 29/629 |

Recent advances in micro-circuit techniques have allowed the size of individual electronic components to be significantly reduced. Thus, while a large number of components may be packages in a very small volume, the need arises to provide a corresponding number of electrical connections. One problem with forming electrical connectors for such packages is that the dimensions and physical tolerances of the connections to the packages are extremely small. That is, the spacing between pads require connectors with such close contact spacing that there is no space for a normal contact spring which is capable of exerting the required contact force over the required deflection range. As a result, resistance values are so high as to be almost unacceptable. Capacitance and inductance values may also be unacceptable.

The aforementioned prior art patents have addressed these problems with success. However, as the technology is in a state of continual change, new and improved connecting devices are required to meet the advancement. Such advancements are being made primarily with respect to printed circuit boards and substrates, the latter particularly so. Further, there is an increasing need for stacking numbers of boards and substrates together with devices for interconnecting the circuits and pads thereon. Such interconnecting devices must be small themselves with the spacing between contacts incredibly tiny, and such devices must be able to accommodate thermal shock and changes without losing the integrity of the electrical contacts.

SUMMARY OF THE INVENTION

According to one aspect of the invention, there is provided a plurality of resilient connecting elements having a sinuous form embedded in a body formed from multilayered strips of elastomeric material, with opposing ends having contacts thereon exposed at opposing surfaces of the elastomeric body.

According to another aspect of the invention, there is provided a method of making an interconnecting device wherein the resilient connecting elements in strip form are embedded in continuous strips of elastomeric material.

DESCRIPTION OF THE INVENTION

Figure 1:
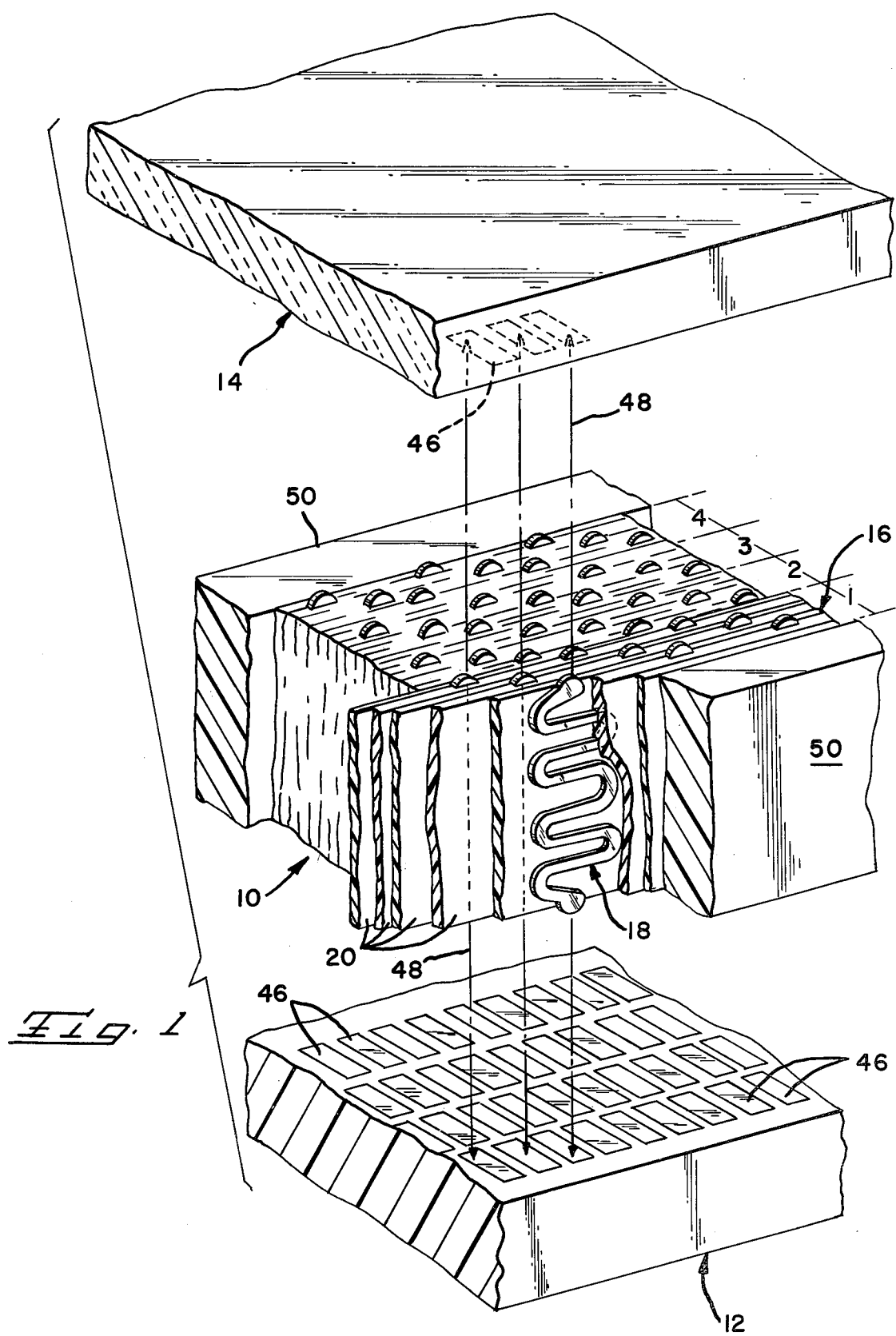
FIG. 1 is a view, generally in perspective but partly sectioned, showing the electrical interconnecting device of the present invention in exploded association with a P.C.B. below and a substrate above which may be electrically interconnected by said device.

The drawing in FIG. 1 shows electrical interconnecting device 10, constructed in accordance with the preferred embodiment of the present invention, positioned between a PCB 12 below and a substrate device 14 above.

Device 10 consists of a plurality of laminates 16 consisting of spaced resilient connecting elements 18 embedded between two layers of elastomeric material 20.

Figure 2:
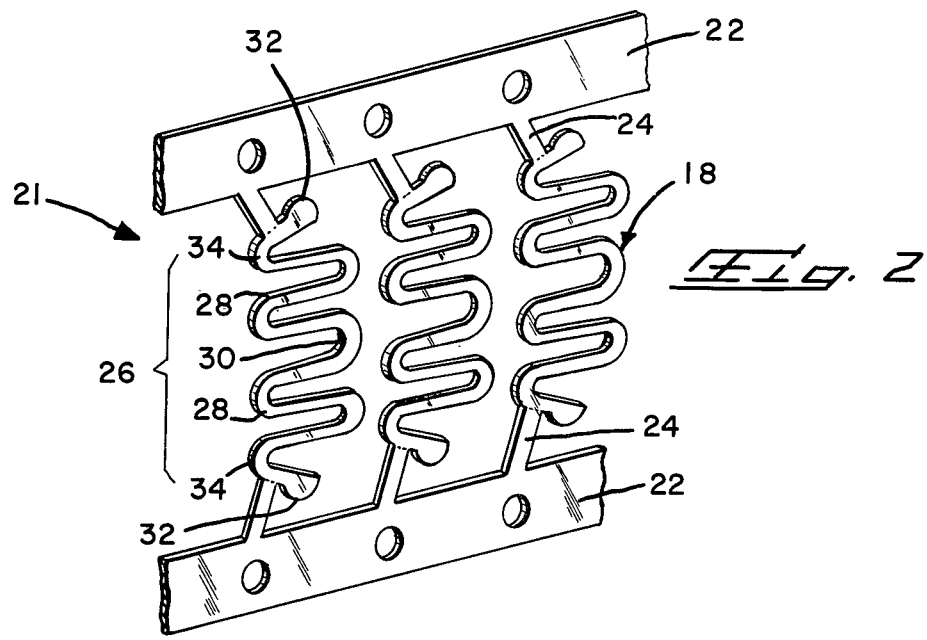
FIG. 2 is a view of a strip of stamped resilient connecting elements which will be embedded in layers of elastomeric material to form the interconnecting device of FIG. 1.
Figure 3:
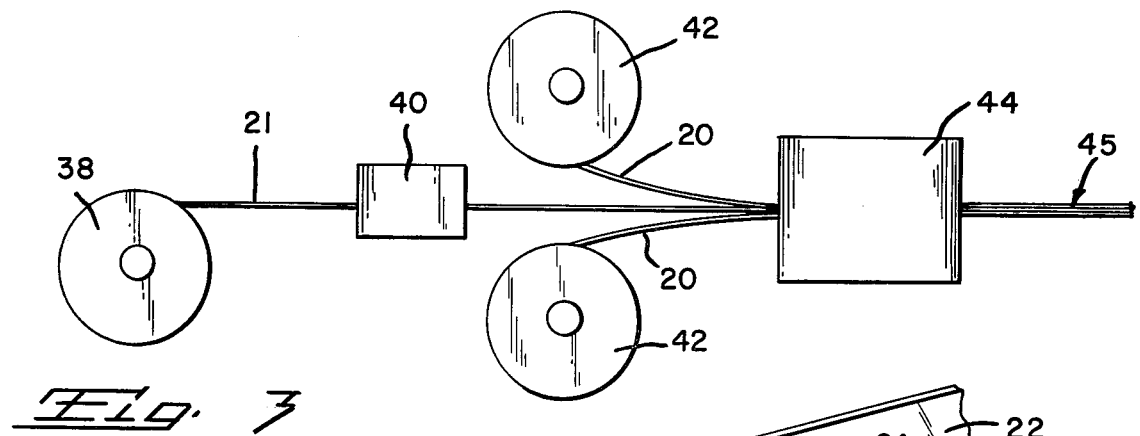
FIG. 3 shows a method of embedding the connectors of FIG. 2 inbetween two strips of elastomeric material.
Figure 4:
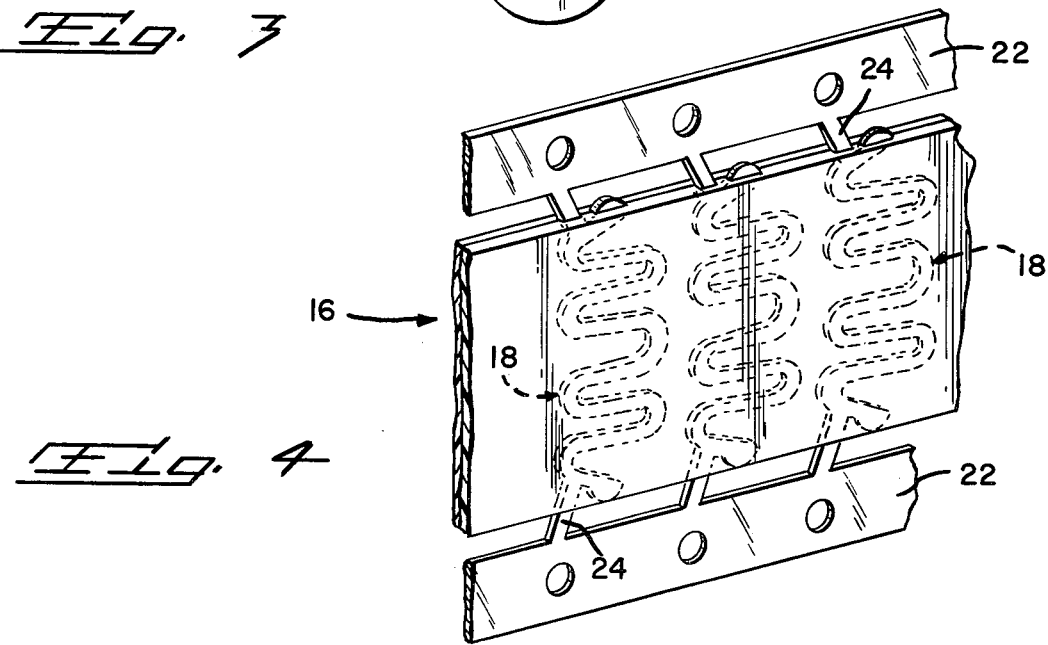
FIG. 4 shows the product of FIG. 3 before trimming off the carrier rails.

The making of laminates 16 is shown in FIGS. 2, 3 and 4 to which attention is now directed.

A strip 21 of resilient connecting elements 18, shown in FIG. 2, is made by stamping a coplanar length of conductive material so as to form the connecting elements connected to carrier rails 22 by straps 24. The preferred material includes stainless steel, plated spring steel and beryllium copper.

Each connecting element 18 comprises a spring section 26 consisting of two S-shaped portions 28 separated by a large bight 30. Further, a contact 32 is connected to the free end of each S-shaped portion by a small bight 34. The connecting element is, as can be seen, symmetric. That is, the top half is the mirror image of the lower half.

Figure 5:
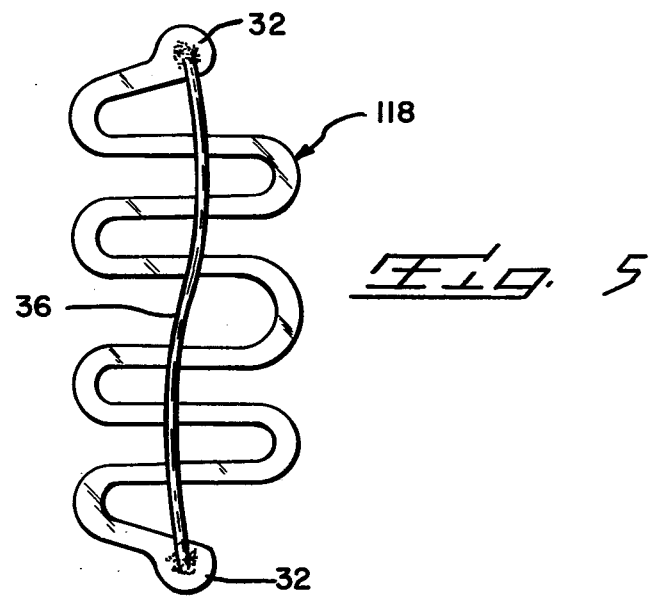
FIG. 5 shows a resilient connector with a shorting lead.

A connecting element 118, shown in FIG. 5, is identical to connecting element 18 except that a shorting wire 36 is welded to both contacts 32 to decrease the distance a current takes from one contact to the other.

FIG. 3 illustrates one method of forming laminates 16. A strip 21 of connecting elements 18, loaded on reel 38, is provided in front of welding station 40. Two reels 42, each containing a continuous roll of elastomeric material 20, are provided below station 40, one reel on either side of strip 21. A bonding station 44 is located below reels 42.

Strip 21 is fed through welding station 40 where shorting wire 36 is attached if desired. From there the strip feeds into bonding station 44 along with the elastomeric material and is bonded together with the strip embedded therein between as shown in FIG. 4. Thereafter carrier rails 22 are removed by cutting straps 24 as close to contacts 32 as possible. Score lines (not shown) may be provided across the straps to facilitate this step.

The machinery and other power means required to perform the method shown in FIG. 3 is conventional and well known and therefore is not shown.

The elastomeric material can be any one of various materials available. For example, the material can be polyurethane suitable composition which has excellent spring characteristics although other elastomers can be used if good high temperature performance is required. The material can be a relatively hard one if desired and/or the spring system can depend upon both the material and the spring characteristics of the connecting elements.

With respect to FIG. 1 again, device 10 consists of a plurality of laminates arranged in a pattern adapted to interconnect the closely spaced circuit pads 46 on PCB 12 and on substrate device 14. Because the pads are so closely spaced, a unit consisting of three laminates of the required length, i.e., having the required number of connecting elements, are secured together so that neighboring connecting elements are on a staggered pattern. In this manner the contacts contact the pads as indicated by arrows 48. As shown, the device consists of four such units. Clearly an interconnecting device using the laminates of the present invention can be of any size and have any number of connecting elements.

Many means are available for housing a number of laminates. In FIG. 1, the housing consists simply of walls 50, one on either side of the units. Additionally various means may be utilized to maintain the laminates in proper registration, one with the other. For example, non-conductive rods (not shown) may engage registration holes in the elastomeric material.

The product of the method shown in FIG. 3 is a continuous ribbon 45 of lamination 16. To make an interconnecting device, the ribbon is cut to provide a number of pieces of a pre-determined length; i.e., with the necessary number of connecting elements 18. These pieces are then secured together side to side to provide the required width.

Figure 6:
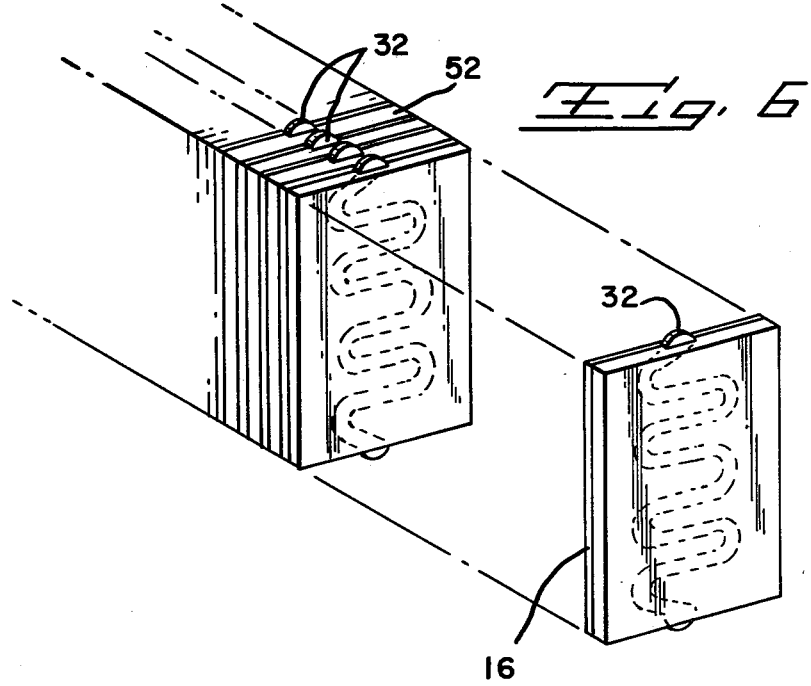
FIG. 6 illustrates an alternative stacking of the electrical interconnecting device of the present invention.

FIG. 6 illustrates how laminates 16 may be used to form an interconnecting device 52. The laminate ribbon 45 is cut so that each piece contains one connecting element 18. The several pieces are secured together laterally to provide the required width. In this device, contacts 32 are directly in alignment, one with the other.

The aforementioned bonding of two strips of elastomeric material with connecting elements 18 therein between can take two forms. In one, such as shown in FIG. 1, the elastomeric material flows around and in between the connector so that no spaces are left. This process results in a laminate having a resiliency of a solid piece. In another process, the elastomeric material does not flow in between the curves and straight sections but rather acts to provide an envelope of sorts. This leaves the connector free to flex to some degree independent of the elastomeric material. Obviously the durometer of the elastomeric material and the spring characteristics of the connector material can be varied to provide interconnecting devices as required.

The present invention may be subject to many modifications and changes without departing from the spirit or essential characteristics thereof. The present embodiments are therefore to be considered in all respects as illustrative and not restrictive of the scope of the invention.

We claim:

1. An interconnecting device for electrically interconnecting printed circuit boards or the like, comprising, an elongated connecting element of conductive material embedded in an elastomeric material, said connecting element having a spring section comprising two S-shaped portions, each connected to and extending from either side of a bight, with contacts at the free ends thereof, said contacts being exposed at two opposing surfaces of the elastomeric material.

2. An interconnecting device for electrically interconnecting printed circuit boards or the like, comprising an elongated connecting element of conductive material embedded in an elastomeric material, said connecting element having a spring section comprising S-shaped portions with contacts at the free ends thereof and further including a shorting wire connected to and extending from the contacts, said contacts being exposed at two opposing surfaces of the elastomeric material.

3. The device of claim 2 further including a plurality of spaced connecting elements embedded in a length of elastomeric material.

4. The device of claim 3 including a plurality of lengths of elastomeric material fastened together side by side.

* * * * *